(12) United States Patent
Dalal

(10) Patent No.: US 8,037,325 B1
(45) Date of Patent: Oct. 11, 2011

(54) SYSTEM AND METHOD FOR DETERMINING POWER CONSUMPTION

(75) Inventor: Jinal Dalal, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 421 days.

(21) Appl. No.: 12/330,887

(22) Filed: Dec. 9, 2008

(51) Int. Cl.
*G06F 1/26* (2006.01)
*G06F 1/32* (2006.01)

(52) U.S. Cl. ........ 713/300; 713/310; 713/320; 713/321; 713/322; 713/323; 713/324; 713/330; 713/340

(58) Field of Classification Search .......... 713/300, 713/310, 320–324, 330, 340
See application file for complete search history.

(56) References Cited

U.S. PATENT DOCUMENTS

| | | | |
|---|---|---|---|
| 5,996,083 A * | 11/1999 | Gupta et al. .............. | 713/322 |
| 6,987,370 B2 * | 1/2006 | Chheda et al. ........... | 318/400.08 |
| 7,096,145 B2 * | 8/2006 | Orenstien et al. ......... | 702/132 |
| 7,398,402 B2 * | 7/2008 | Park ......................... | 713/300 |
| 7,613,935 B2 * | 11/2009 | Schumacher et al. ..... | 713/300 |
| 7,653,824 B2 * | 1/2010 | Rangarajan et al. ...... | 713/300 |
| 2003/0138115 A1 * | 7/2003 | Krochmal et al. ........ | 381/94.1 |
| 2006/0074585 A1 * | 4/2006 | Reinberg et al. .......... | 702/130 |
| 2006/0123807 A1 * | 6/2006 | Sullivan et al. ............ | 62/129 |
| 2007/0028129 A1 * | 2/2007 | Schumacher et al. ..... | 713/320 |
| 2007/0162582 A1 * | 7/2007 | Belali et al. ............... | 709/223 |
| 2008/0200220 A1 * | 8/2008 | Jackson .................... | 455/574 |
| 2008/0229127 A1 * | 9/2008 | Felter et al. ............... | 713/320 |
| 2009/0197532 A1 * | 8/2009 | Wyper ...................... | 455/41.2 |
| 2009/0327553 A1 * | 12/2009 | Fletcher .................... | 710/262 |
| 2010/0115293 A1 * | 5/2010 | Rotem et al. .............. | 713/300 |

OTHER PUBLICATIONS http://www.intel.com/technology/itj/2006/volumn10issue02/art04_Memory_Power_Management.

\* cited by examiner

*Primary Examiner* — M Elamin

(74) *Attorney, Agent, or Firm* — Lerner, David, Littenberg, Krumholz & Mentlik, LLP

(57) ABSTRACT

A system and method is provided to measure the power consumption of circuits whereby, in one aspect, a processor's temperature is maintained so that its power consumption is measured at the point the processor throttles.

13 Claims, 3 Drawing Sheets

SYSTEM AND METHOD FOR DETERMINING POWER CONSUMPTION

BACKGROUND OF THE INVENTION

Processors are comprised of individual circuits such as transistors, and each operation performed at a circuit typically requires at least a small amount of power. The operation of a circuit often generates a small amount of heat as a byproduct. While each individual circuit may use relatively little power and generate relatively little heat, current processors include millions—and often hundreds of millions—of densely packed circuits. The amount of heat generated by the processor further increases as the demands on the processor increase because more circuits are used more often. If the processor becomes too hot, the heat may damage the circuits.

A number of different systems and methods have been used to mitigate this problem. For example, some chips decrease the usage of their components (known as "throttling") to prevent overheating. For example, a chip may decrease its clock speed so that the operations are performed more slowly, which gives the chip a little more time to cool down. The chip may also decrease the number of components it uses to perform operations. The chip may use other techniques as well, either alone or in combination with the foregoing techniques.

Typically, chips throttle when they reach a certain temperature, or at least assume that they reached or are approaching a particular temperature by monitoring their circuit usage. It is often preferable to prevent a chip from reaching the throttling stage because it indicates that the chip is working at less than peak efficiency.

Reducing the temperature of the chip's environment can help prevent overheating and throttling. For example, a computer may be placed in an air-conditioned location and a fan used to blow the cooler air across the processors in the computer. Other cooling methods are also available, such as liquid cooling.

Because not all processors are the same, it is helpful to know how much heat the processor will generate when designing a cooling system for the processor. Cooling systems can be expensive, which means that making a system cooler than necessary can result in unwarranted expense (e.g., faster fans often cost more than slower ones). On the other hand, if the system is not cool enough, the processor may get too hot and throttle.

Accordingly, to help system designers, processor manufactures will often define the "Total Dissipated Power" (TDP) of a processor. However, this information tends to define a distribution curve with a high variation across individual processors, which can prevent system designers from designing for the reasonable worst case. For example, if the TDP indicates an average power consumption of 80 watts and the cooling system is perfectly designed for the average, then many of the processors will underperform.

Some systems and methods measure the power consumed by processors when running programs. However, such systems unsatisfactorily address issues associated with the thermal aspects of the processor and, thus, can be unpredictable. For example, some systems and methods measure the consumed power in a way that changes depending on the temperature of the surrounding environment, thus requiring replication of the external environment in order to provide results that can be meaningfully compared with other processors.

BRIEF SUMMARY OF THE INVENTION

One aspect of method in accordance with the invention determines the power consumption of a processor having a clock speed. The method includes supplying power to a processor, whereby the amount of power applied to the processor changes over time. It also includes regulating the amount of external cooling applied to the processor so as to cause the processor to periodically decrease and increase its clock speed. Yet further, it determines the amount of power to the processor when the length of time associated with the decreased clock speed and length of time associated with the increased clock speed reach a predetermined characteristic.

In another aspect of the invention, a system is provided that includes: a circuit; a device such as but not limited to a fan for cooling the circuit; a power source such as but not limited to a voltage regulator for providing power to the circuit; a controller such as but not limited to a microprocessor in communication with the cooling device so as to control the performance of the circuit by regulating the cooling device; and a user output such as but not limited to a display to provide, to a user, information related to the power supplied by the power source to the circuit when the performance of the circuit reaches a predetermined threshold.

In yet another aspect of the invention, a method is provided to determine the power consumption of a circuit, wherein the temperature of the circuit depends on the amount of operations performed by the circuit and wherein the circuit decreases the amount of the operations it performs depending on the temperature. The method includes: supplying power to the circuit; changing the ambient temperature of the circuit until a predetermined threshold is achieved, wherein the threshold is based on (1) the amount of time the circuit is not decreasing the amount of operations due to the temperature of the circuit relative to (2) the amount of time the circuit is decreasing the amount of operations due to the temperature of the circuit; and determining the power consumption when the threshold is achieved.

Other aspects of the invention are described below.

DETAILED DESCRIPTION

One aspect of the invention provides a system and method for determining the power consumed by a processor so that an appropriate cooling system can be designed. The processor is stressed, and allowed to heat and cool, until it reaches a desired state of throttling versus non-throttling, at which point its power consumption is measured.

Figure 1:
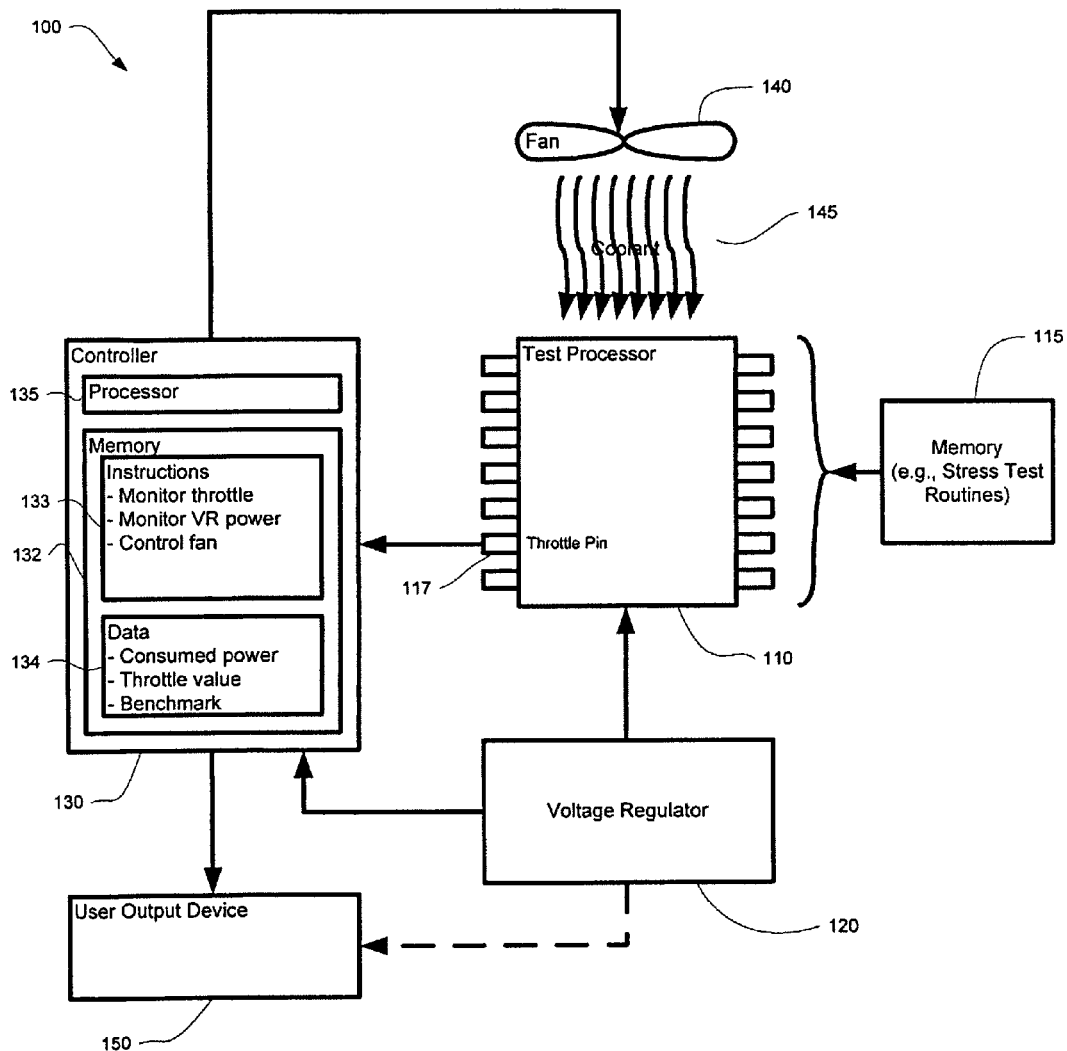
FIG. 1 is a system diagram of an aspect of the invention.

A system 100 in accordance with an aspect of the invention is shown in FIG. 1. The system includes a test processor 110 with access to programs in memory 115 (such as a hard drive), voltage regulator 120, controller 130 and cooling device 140.

Test processor 110 is a processor whose performance with respect to thermal characteristics is to be tested. It will be understood that processor 110 is not limited to any particular type of processor, and may thus be a general purpose microprocessor, ASIC, integrated circuit, or a circuit whose performance is controllable to reduce its thermal output. In one aspect, the circuit to be tested is a microprocessor for a general purpose computer such as a server or personal computer.

Test processor 110 includes inputs and outputs, such as pins.

In one aspect of the system and method, one of those outputs is a value indicative of the extent to which the processor has decreased its operations due to the temperature (actual or assumed) of all or a portion of the processor. In that regard, the output may comprise a throttle pin 117. For example, certain Intel processors provide a pin that outputs a signal having one of two values indicating whether the chip is throttling (e.g., the pin outputs a 0V signal) or is not throttling (e.g., the pin outputs a 3V signal).

System 100 further includes a source of power to the test processor such as voltage regulator 120. Oftentimes, the processor will draw more power as it performs more operations. Typically, the additional power is consumed by drawing more current rather than changing the voltage, but certain processor may vary voltage demands as well.

Voltage regulator 120 outputs a value that indicative of the power provided to the processor 110.

The system shown in FIG. 1 also includes a controller 130. The controller may have access to a memory 132 storing data 134 and instructions 133. The instructions are executable by a processor 135 or similar circuitry. In accordance with those instructions, the processor is capable of retrieving and storing data 134. For example, a general purpose microcontroller, such as Atmel's ATmega8 microcontroller, may be programmed with instructions performing the functions described below.

The controller accepts different information as input. For example, it may accept information indicative of the performance of the processor 110 based on the temperature, such as by directly or indirectly receiving the signal at throttle pin 117. Similarly, it may accept information indicative of the power consumed by the processor, such as by directly or indirectly receiving the signal output by voltage regulator 120 that indicates the power supplied to the processor 110.

The values received by the controller may be stored in data 134.

The controller 130 may also send a signal (not shown) to the processor 110 and voltage regulator 120 instructing them to turn on and begin operating.

System 100 also includes a device for cooling the test processor 120. As shown in FIG. 1, the device may be a fan 140 passing cooler air 145 over the processor 110.

Fan 140 operates under the control of controller 130. In one aspect, the fan is controlled by PWM whereby the controller sends a series of pulses to the fan to turn on or off; the closer the pulses, the faster the fan turns and the more cooling it provides. In another aspect, the controller sends a desired RPM, which the fan implements.

System 100 further includes a user output device in direct or indirect communication with controller 130 so as to provide, to users, information that is accessible by the controller. As shown by the dashed arrow between the voltage regulator 120 and display 130 in FIG. 1, the output may thus indirectly convey information received from voltage regulator 120 or, alternatively, may be connected directly to the voltage regulator. The output is not limited to any particular device, but may comprise any device capable of conveying information to a user such as but not limited to a monitor, printer, speaker, or communication line that provides information directly or indirectly to the foregoing.

Figure 2:
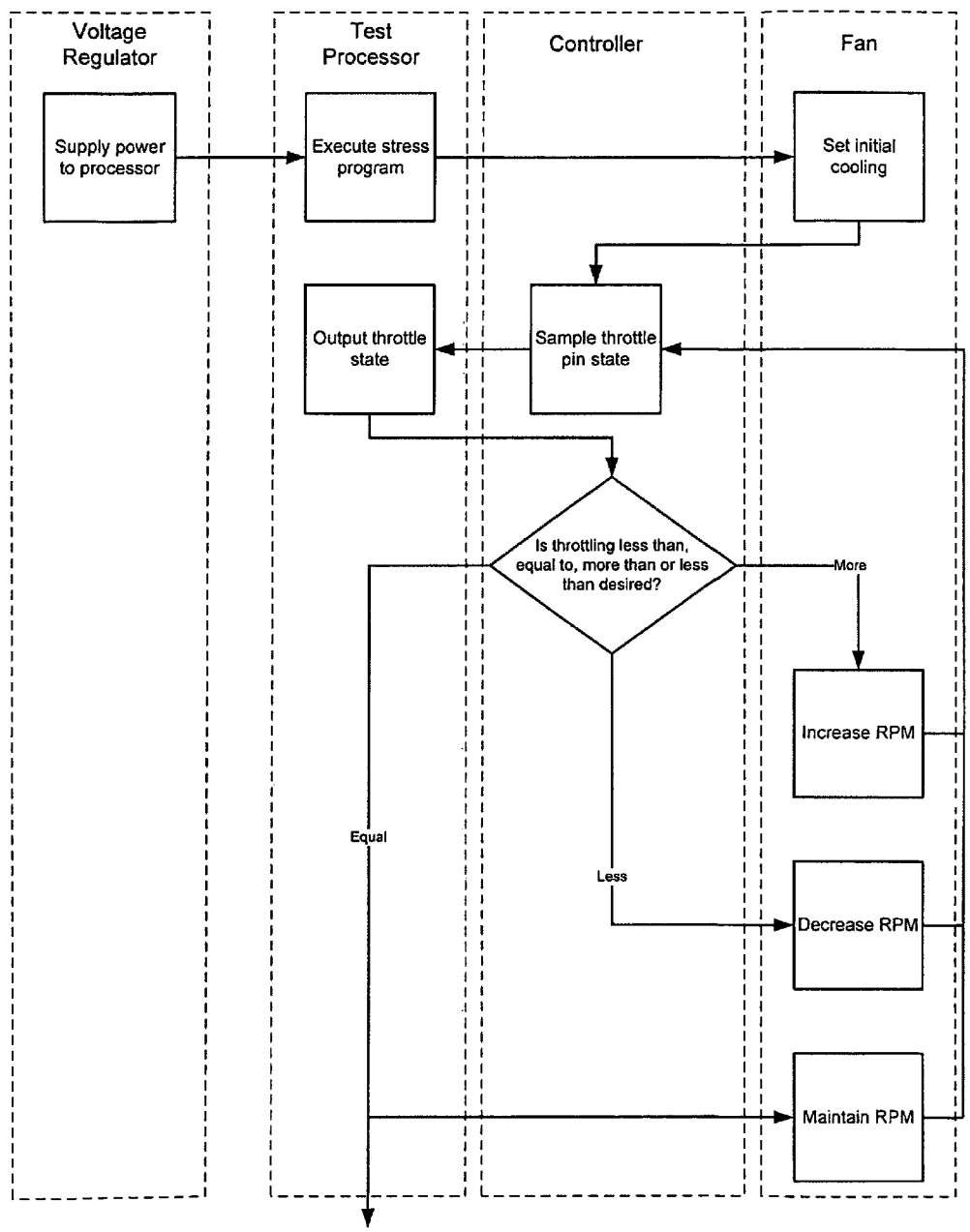
FIG. 2 is a flow chart of an aspect of the invention.
Figure 3:
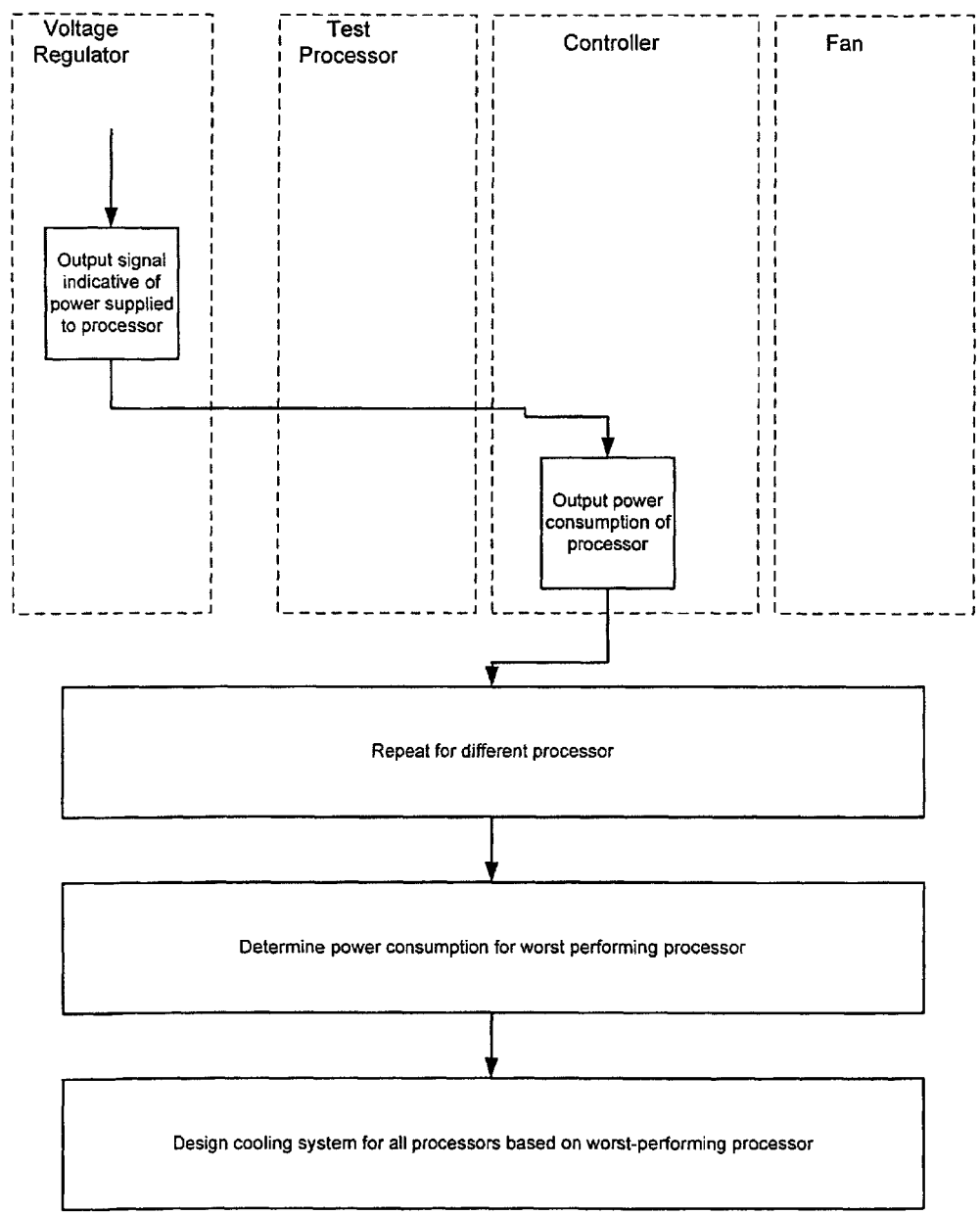
FIG. 3 is a flow chart of an aspect of the invention.

In addition to the operations illustrated in FIGS. 2 and 3, various operations in accordance with a variety of aspects of the invention will now be described. It should be understood that the following operations do not have to be performed in the precise order described below. Rather, various steps can be handled in reverse order or simultaneously.

The process may begin by connecting the processor to be tested to the other units of the system as applicable. This may include, but is not limited to, mounting test processor 110 on a motherboard on which the other components of the system are also mounted. The starting temperature of the system may be ambient temperature and the motherboard stored in an open chassis.

The test processor 110 loads a test program from memory 115 (such as a hard drive or other memory device) or otherwise accesses a set of instructions to be executed by the processor 110 (e.g., instructions that are prestored in the chip). In one aspect of the system and method, the test program is a stress test designed to tax the processor's processing abilities to the limit by making as many circuits of the test processor as busy as practical.

Voltage regulator 120 provides power to the test processor 110 as it executes instructions. The amount of power will tend to increase over time as the test processor 110 operates more circuits. A certain amount of this power may be lost in the form of heat.

As the amount of power consumed by the test processor changes over a time, voltage regulator 120 outputs this amount to controller 130. In accordance with instructions 133, the processor 135 of controller 130 monitors the amount of power and logs it as data 134.

Controller 130 also monitors the throttle pin 117 of test processor 110. For example, the signal from the throttle pin may be sampled 1,000 times a second. In one aspect of the invention, the samples are stored in data 134. In another aspect of the invention, the samples are not stored until the signal indicates that throttling has begun.

In one aspect of the system and method and during the initial stages, the cooling device of the system and method is set to allow the processor being tested to heat up. For example, the fan 140 may be switched off, or run at a low speed (such as 2000 rpm at an ambient temperature of 25 C), from the beginning of the test until the controller receives the first indication that the processor is throttling.

At some point, the processor will start to throttle. In the system shown in FIG. 1, this will be indicated by the signal at the throttle pin going from high to low.

Rather than letting the processor throttle indefinitely, the controller 130 will cool the processor. One system and method in which this may be accomplished is to change the ambient temperature of the processor, such as by activating the cooling device to apply more coolant to the processor. For example, the RPM of the fan 140 may be increased to blow more cool air across the processor 110. One method of accomplishing this is for the instructions 133 to tie the PWM fan signal, directly or indirectly, to the signal received from the throttle pin. This may continue until the throttling ceases.

When the controller 130 determines that the throttling has ceased, the controller may diminish the cooling until the processor begins to throttle again.

This process (allowing the processor to heat until it throttles, cooling the processor until it stops throttling, and then allowing the processor to heat up again) may be repeated numerous times.

The controller brings the test processor to a point of controlled throttling. For example, the controller 130 may control the speed of fan 140 until the processor spends as much time throttling as not (i.e., a 50% duty cycle). In that regard, the controller may sample the signal at the throttle pin and adjust the fan speed higher or lower depending on whether most of samples indicate throttling or not throttling.

Once the controller determines that the processor is at a desired state with respect to throttling, the controller may store a benchmark associated with the processor's power consumption. For example, if the 50% duty cycle is achieved for approximately 5 minutes, the controller may assign and store a benchmark in data 134 equivalent to the power then being consumed by the test processor (e.g., 90 watts).

The process may be repeated for multiple processors. In one aspect, when a new model of processors is purchased in bulk, a sample number (e.g., 100) out of a bin (e.g., 10,000) may be tested and their power consumption benchmarks stored. Using the foregoing example, the 100 processors may have benchmarks in the range of 80 to 94 watts.

The power consumption benchmarks may be used to design the cooling system. Whether the system is being defined for an individual processor or the worst-case of a bin of processors, the cooling system may be designed accordingly. Once the system is designed in accordance with the characteristics of the worst (from a power consumption point of view) processor in the bin, the thermal solution will typically be sufficient for any processor in the bin.

As will be seen, one system and method in accordance with the invention allows the creation of a power consumption benchmark that exists independent of the cooling system. In this aspect, the surrounding temperature does not affect the benchmark because the processor is measured at its throttling point regardless of the external temperature. One manner in which this may be achieved is to use a controller to regulate the performance of the circuit by controlling a cooling device.

One of the advantages of the present invention is its ability to accommodate a wide variety of alternatives.

For example, rather than relying on the throttle signal as input, the controller may rely on other performance indicators such as clock speed. Some aspects may also measure and rely on the external temperature of the CPU; however, some of those aspects may not have the feature of being independent of external temperature. Combinations of one or more of the foregoing may also be used.

Similarly, using a 50% throttling duty cycle is particularly advantageous because the processor is measured at a point where it is edge of the throttling; it is throttling and not throttling in equal measure. However, percentages above and below 50% may be used as well and provide their own advantages depending on system design preferences. Moreover, the target with respect to throttling need not be a direct ratio based on the time spent throttling versus non-throttling time.

Alternatives of the system shown in FIG. 1 are also possible. By way of example only, rather than using a single controller 130, a separate and dedicated fan controller may be tied to the throttle pin, and a display may be connected to the power supply.

Yet further, in certain aspects of the system and method, the temperature of the circuit may also be heated as well as (or instead of) cooled in order to bring (or more quickly bring) the circuit to a temperature wherein it throttles.

Most of the foregoing alternative embodiments are not mutually exclusive, but may be implemented in various combinations to achieve unique advantages. As these and other variations and combinations of the features discussed above can be utilized without departing from the invention as defined by the claims, the foregoing description of the embodiments should be taken by way of illustration rather than by way of limitation of the invention as defined by the claims.

The invention claimed is:

1. A method of determining the power consumption of a circuit, wherein the temperature of the circuit depends on the amount of operations performed by the circuit and wherein the circuit decreases the amount of the operations it performs depending on the temperature, the method comprising:
   supplying power to the circuit;
   changing the ambient temperature of the circuit until a predetermined threshold is achieved, wherein the threshold is based on (1) the amount of time the circuit is not decreasing the amount of operations due to the temperature of the circuit relative to (2) the amount of time the circuit is decreasing the amount of operations due to the temperature of the circuit; and
   determining the power consumption when the threshold is achieved.

2. The method of claim 1 wherein the ambient temperature of the circuit is decreased by applying a coolant.

3. The method of claim 2 wherein the coolant comprises cooled air provided by a fan.

4. The method of claim 1 wherein a voltage regulator supplies the power to the circuit, the voltage regulator outputs a signal indicative of the supplied power, and the power consumption is determined by reading the signal from the voltage regulator.

5. The method of claim 1 wherein changing the ambient temperature comprises decreasing the ambient temperature when the circuit is decreasing the amount of operations due to temperature of the circuit.

6. The method of claim 1 wherein the threshold is a ratio of (1) the amount of time the circuit is not decreasing the amount of operations due to the temperature of the circuit relative to (2) the amount of time the circuit is decreasing the amount of operations due to the temperature of the circuit.

7. The method of claim 6 wherein the ratio is 50%.

8. The method of claim 6 wherein the ratio is greater than 50%.

9. The method of claim 6 wherein the ratio is less than 50%.

10. The method of claim 1 further comprising designing a cooling system for the circuit based on the determined power consumption.

11. The method of claim 1 further comprising supplying power and changing the ambient temperature so as to determine the power consumption of a plurality of circuits, and wherein the cooling system for the plurality of circuits is designed based on the power consumption of one of the plurality of processors.

12. The method of claim 11 wherein the cooling system for the plurality of circuits is designed based on the circuit having the highest power consumption.

13. The method of claim 1 wherein the circuit is a processor for a general purpose computer.

* * * * *